(12) United States Patent
Hamada et al.

(10) Patent No.: US 10,515,758 B2
(45) Date of Patent: Dec. 24, 2019

(54) METHOD OF MANUFACTURING COIL COMPONENT

(71) Applicant: Murata Manufacturing Co., Ltd., Kyoto (JP)

(72) Inventors: Akinori Hamada, Nagaokakyo (JP); Kenji Nishiyama, Nagaokakyo (JP); Shinji Yasuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 251 days.

(21) Appl. No.: 15/846,742

(22) Filed: Dec. 19, 2017

(65) Prior Publication Data

US 2018/0108475 A1 Apr. 19, 2018

Related U.S. Application Data

(63) Continuation of application No. PCT/JP2016/065172, filed on May 23, 2016.

(30) Foreign Application Priority Data

Jun. 24, 2015 (JP) .................................. 2015-126923

(51) Int. Cl.
| | |
|---|---|
| *H01F 7/06* | (2006.01) |
| *H01F 41/02* | (2006.01) |
| *H01F 41/04* | (2006.01) |
| *H01F 17/00* | (2006.01) |
| *H05K 1/16* | (2006.01) |
| *H05K 3/46* | (2006.01) |

(52) U.S. Cl.
CPC ............. *H01F 41/02* (2013.01); *H01F 17/00* (2013.01); *H01F 41/04* (2013.01); *H05K 1/165* (2013.01);

(Continued)

(58) Field of Classification Search
CPC .... H01F 17/00; H01F 27/245; H01F 27/2823; H01F 41/02; H01F 41/04; H05K 1/165; H05K 3/4682
See application file for complete search history.

(56) References Cited

U.S. PATENT DOCUMENTS 6,178,623 B1 * 1/2001 Kitazawa ................. C25D 5/10
29/825
9,786,424 B2 * 10/2017 Park .................... H01F 17/0033
(Continued)

FOREIGN PATENT DOCUMENTS

| JP | H10-290544 A | 10/1998 |
|---|---|---|
| JP | 2005-243807 A | 9/2005 |

(Continued)

OTHER PUBLICATIONS

An Office Action; "Notification of Reasons for Refusal," issued by the Japanese Patent Office dated Sep. 18, 2018, which corresponds to Japanese Patent Application No. 2017-524752 and is related to U.S. Appl. No. 15/846,742; with English language translation.

(Continued)

*Primary Examiner* — Paul D Kim
(74) *Attorney, Agent, or Firm* — Studebaker & Brackett PC

(57) ABSTRACT

A method of manufacturing a coil component includes the steps of disposing a dummy metal layer on a base; laminating a base insulating resin on the dummy metal layer; exposing the dummy metal layer by disposing an opening part in the base insulating resin; disposing a spiral wiring on the base insulating resin and disposing a sacrificial conductor on the dummy metal layer in the opening part of the base insulating resin; enlarging the sacrificial conductor by plating by energizing the dummy metal layer; covering the spiral wiring and the sacrificial conductor with an insulating resin; exposing the sacrificial conductor by disposing an opening (Continued)

part in the insulating resin; forming a hole part by removing the sacrificial conductor by etching from the opening part of the insulating resin; and constructing the inner magnetic path of a magnetic resin by filling the hole part with the magnetic resin.

8 Claims, 14 Drawing Sheets

(52) U.S. Cl.
CPC ..... *H05K 3/4682* (2013.01); *H05K 2203/308* (2013.01)

(56) References Cited

U.S. PATENT DOCUMENTS

| | | | |
|---|---|---|---|
| 9,814,167 B2* | 11/2017 | Park | H05K 9/0067 |
| 9,972,436 B2* | 5/2018 | Hamada | H01F 41/04 |
| 10,039,190 B2* | 7/2018 | Yoshioka | G07D 7/164 |

FOREIGN PATENT DOCUMENTS

| | | |
|---|---|---|
| JP | 2006-278912 A | 10/2006 |
| JP | 2007-227729 A | 9/2007 |
| JP | 2010-171170 A | 8/2010 |
| JP | 2013-225718 A | 10/2013 |
| JP | 2016-072407 A | 5/2016 |

OTHER PUBLICATIONS

International Search Report issued in PCT/JP2016/065172; dated Aug. 9, 2016.
Written Opinion issued in PCT/JP2016/065172; dated Aug. 9, 2016.
International Preliminary Report on Patentability issued in PCT/JP2016/065172; dated Dec. 26, 2017.

* cited by examiner

METHOD OF MANUFACTURING COIL COMPONENT

CROSS REFERENCE TO RELATED APPLICATIONS

This application claims benefit of priority to Japanese Patent Application 2015-126923 filed Jun. 24, 2015, and the International Application PCT/JP2016/065172 filed May 23, 2016, the entire content of which is incorporated herein by reference.

TECHNICAL FIELD

The present disclosure relates to a method of manufacturing a coil component.

BACKGROUND

Conventional coil components include a coil component described in Japanese Laid-Open Patent Publication No. 2013-225718. In a method of manufacturing this coil component, a hole part for an inner magnetic path is formed in a substrate and spiral wirings are disposed on the upper and lower surfaces of the substrate by photolithography etc.

SUMMARY

Technical Problem

It was found that the following problem exists when it is attempted to actually manufacture the conventional coil component. Specifically, considering the total of the position tolerance of the hole part with respect to the substrate and the position tolerance of the spiral wirings with respect to the substrate, a certain distance is required between the spiral wirings and the hole part. Therefore, the cross-sectional area of the hole part becomes smaller by the position tolerance of the hole part and the position tolerance of the spiral wirings. As a result, a cross-sectional area of an inner magnetic path becomes small and a high inductance value is difficult to acquire.

Therefore, a problem to be solved by the present disclosure is to provide a method of manufacturing a coil component capable of increasing the cross-sectional area of the inner magnetic path and acquiring a higher inductance value.

Solution to Problem

To solve the problem, a method of manufacturing a coil component of an aspect of the present disclosure comprises the steps of disposing a dummy metal layer on a base;

laminating a base insulating resin on the dummy metal layer;

exposing the dummy metal layer by disposing an opening part in the base insulating resin;

disposing a first spiral wiring on the base insulating resin and disposing a first sacrificial conductor corresponding to an inner magnetic path on the dummy metal layer in the opening part of the base insulating resin;

enlarging the first spiral wiring by plating by directly or indirectly energizing the first spiral wiring, and enlarging the first sacrificial conductor connected to the dummy metal layer by plating by energizing the dummy metal layer;

covering the first spiral wiring and the first sacrificial conductor with the first insulating resin;

exposing the first sacrificial conductor by disposing an opening part in a first insulating resin;

forming a hole part corresponding to the inner magnetic path by removing the first sacrificial conductor by etching from the opening part of the first insulating resin; and constructing the inner magnetic path of a magnetic resin by filling the hole part with the magnetic resin.

According to the method of manufacturing a coil component of an aspect of the present disclosure, the first spiral wiring and the first sacrificial conductor are disposed at one step. In particular, the first spiral wiring and the first sacrificial conductor are both conductors and therefore can be formed at one step. This reduces the total of the position tolerance of the hole part (the sacrificial conductor) for the inner magnetic path with respect to the insulating resin and the position tolerance of the spiral wiring with respect to the insulating resin. As a result, the cross-sectional area of the inner magnetic path can be increased and a higher inductance value can be acquired.

The first spiral wiring is directly or indirectly energized to enlarge the first spiral wiring by plating, and the dummy metal layer is energized to enlarge the first sacrificial conductor connected to the dummy metal layer by plating. As a result, a difference can be eliminated between the thickness of the first spiral wiring and the thickness of the first sacrificial conductor. Therefore, when the opening part is disposed in the first insulating resin covering the first spiral wiring and the first sacrificial conductor to expose the first sacrificial conductor, the depth of the opening part is shallow, so that the opening part can easily be formed.

An embodiment of the method of manufacturing a coil component comprises between the step of exposing the first sacrificial conductor and the step of forming the hole part, a step of disposing a second spiral wiring on the first insulating resin and disposing a second sacrificial conductor corresponding to the inner magnetic path on the first sacrificial conductor in the opening part of the first insulating resin, a step of enlarging the second spiral wiring by plating by directly or indirectly energizing the second spiral wiring, and enlarging the second sacrificial conductor by plating through the first sacrificial conductor by energizing the dummy metal layer, a step of covering the second spiral wiring and the second sacrificial conductor with a second insulating resin, and a step of exposing the second sacrificial conductor by disposing an opening part in the second insulating resin, and the step of forming the hole part includes forming the hole part corresponding to the inner magnetic path by removing the first sacrificial conductor and the second sacrificial conductor by etching from the opening part of the second insulating resin.

According to the embodiment, the second spiral wiring and the second sacrificial conductor are disposed at one step. In particular, the second spiral wiring and the second sacrificial conductor are both conductors and therefore can be formed at one step. This reduces the total of the position tolerance of the hole part (the sacrificial conductor) for the inner magnetic path with respect to the insulating resin and the position tolerance of the spiral wiring with respect to the insulating resin. As a result, the cross-sectional area of the inner magnetic path can be increased and a higher inductance value can be acquired.

The second spiral wiring is directly or indirectly energized to enlarge the second spiral wiring by plating, and the dummy metal layer is energized to enlarge the second sacrificial conductor by plating through the first sacrificial conductor. As a result, a difference can be eliminated between the thickness of the second spiral wiring and the thickness of the second sacrificial conductor. Therefore, the depth of the opening part disposed in the second insulating resin is the same as the depth of the opening part of the first insulating resin. Furthermore, even when multiple layers are formed, the depths of the opening parts are constant, so that the opening parts can easily be formed. Additionally, the shapes of the sacrificial conductors disposed in the opening parts can be made constant.

In an embodiment of the method of manufacturing a coil component, the step of enlarging the first spiral wiring and the first sacrificial conductor by plating includes energizing the first spiral wiring and the first sacrificial conductor at the same time, and the step of enlarging the second spiral wiring and the second sacrificial conductor by plating includes energizing the second spiral wiring and the second sacrificial conductor at the same time.

According to the embodiment, since the first spiral wiring and the first sacrificial conductor are energized at the same time and the second spiral conductor and the second sacrificial conductor are energized at the same time, the processing time of the plating can be shortened.

In an embodiment of the method of manufacturing a coil component, the opening part of the base insulating resin and the opening part of the first insulating resin are annularly opened.

According to the embodiment, since the opening part of the base insulating resin and the opening part of the first insulating resin are annularly opened, the processing load of the opening by laser processing etc. can be reduced. Additionally, since the insulating resin is left in the center of the opening parts, the material of the sacrificial conductors to be used can be reduced.

An embodiment of the method of manufacturing a coil component comprises between the step of forming the hole part and the step of constructing the inner magnetic path, a step of peeling the base from the dummy metal layer at a boundary plane between the base and the dummy metal layer.

According to the embodiment, since the base is peeled from the dummy metal layer at the boundary plane between the base and the dummy metal layer, the insulating resin is not in contact with the base. Therefore, at the time of thermal shock or reflow loading, delamination can be prevented from occurring due to thermal stress generated by a difference in linear expansion coefficient between the base and the insulating resin.

An embodiment of the method of manufacturing a coil component comprises the steps of disposing a dummy metal layer on a base;

laminating a base insulating resin on the dummy metal layer;

exposing the dummy metal layer by disposing an opening part in the base insulating resin;

disposing a first spiral wiring on the base insulating resin and disposing a first sacrificial conductor corresponding to an inner magnetic path on the dummy metal layer in the opening part of the base insulating resin;

enlarging the first sacrificial conductor connected to the dummy metal layer by plating by energizing the dummy metal layer;

covering the first spiral wiring and the first sacrificial conductor with the first insulating resin;

exposing the first sacrificial conductor by disposing an opening part in the first insulating resin;

forming a hole part corresponding to the inner magnetic path by removing the first sacrificial conductor by etching from the opening part of the first insulating resin; and constructing the inner magnetic path of a magnetic resin by filling the hole part with the magnetic resin.

An embodiment of the method of manufacturing a coil component comprises between the step of exposing the first sacrificial conductor and the step of forming the hole part, a step of disposing a second spiral wiring on the first insulating resin and disposing a second sacrificial conductor corresponding to the inner magnetic path on the first sacrificial conductor in the opening part of the first insulating resin, a step of enlarging the second sacrificial conductor by plating through the first sacrificial conductor by energizing the dummy metal layer, a step of covering the second spiral wiring and the second sacrificial conductor with the second insulating resin, and a step of exposing the second sacrificial conductor by disposing an opening part in the second insulating resin, and the step of forming the hole part includes forming the hole part corresponding to the inner magnetic path by removing the first sacrificial conductor and the second sacrificial conductor by etching from the opening part of the second insulating resin.

Effect of the Disclosure

According to the method of manufacturing a coil component of the present disclosure, since the first spiral wiring and the first sacrificial conductor are disposed at one step, the cross-sectional area of the inner magnetic path can be increased and a higher inductance value can be acquired.

DETAILED DESCRIPTION

The present disclosure will now be described in detail with reference to shown embodiments.

Figure 1:
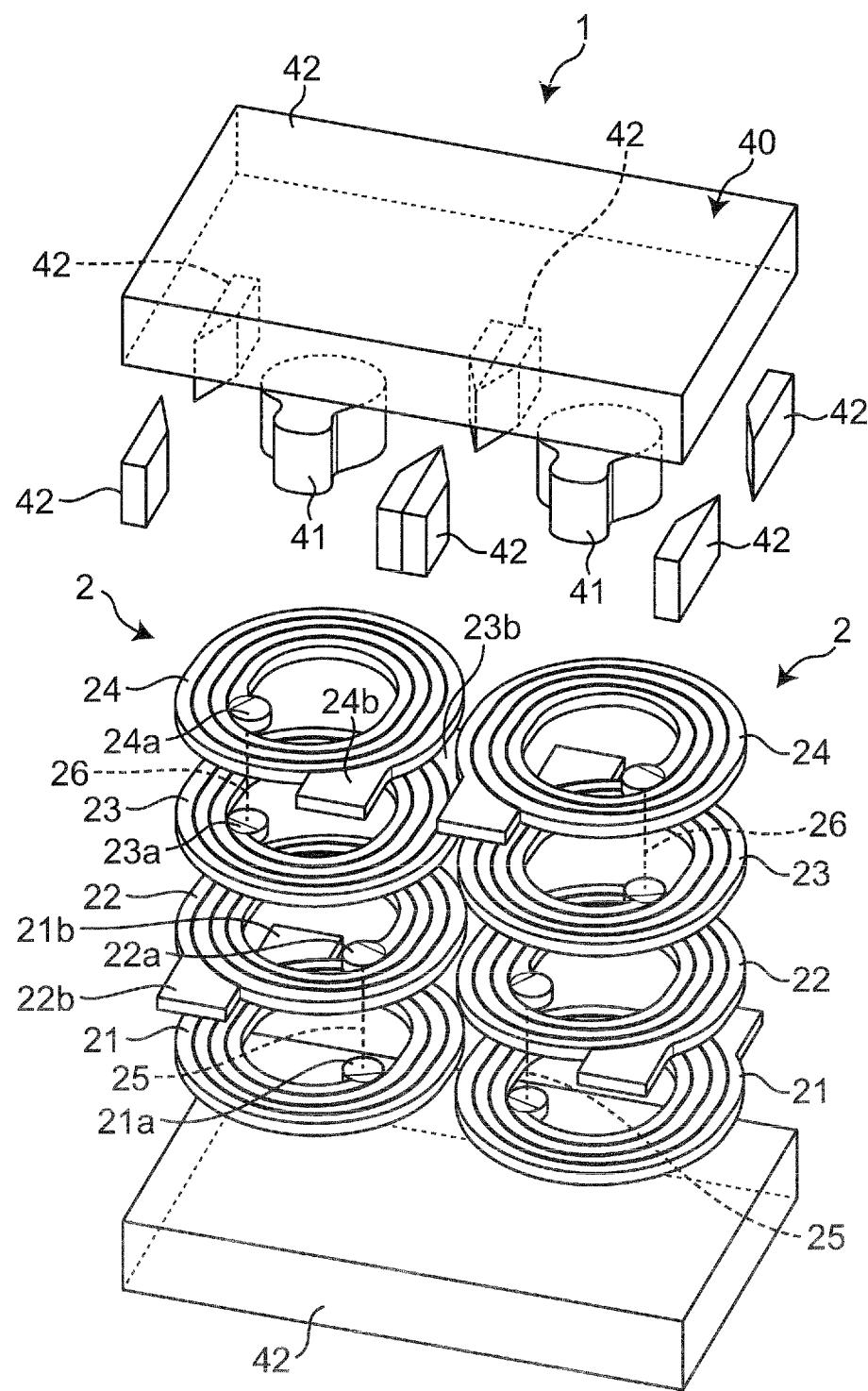
FIG. 1 is an exploded perspective view of an electronic component including an embodiment of a coil component of the present disclosure.
Figure 2:
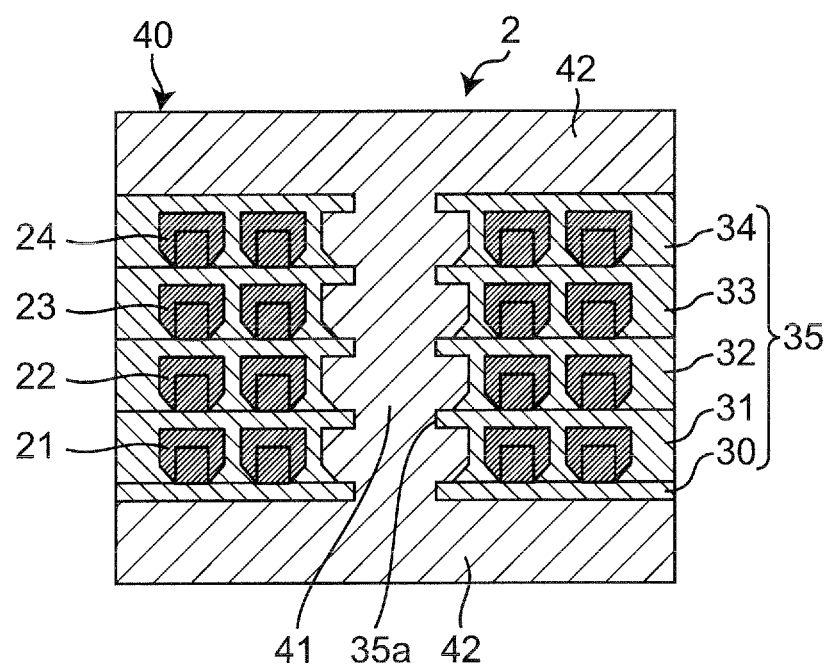
FIG. 2 is a cross-sectional view of the coil component.

FIG. 1 is an exploded perspective view of an electronic component including an embodiment of a coil component of the present disclosure. FIG. 2 is a cross-sectional view of the coil component. As shown in FIG. 1, an electronic component 1 is mounted on an electronic device such as a personal computer, a DVD player, a digital camera, a TV, a portable telephone, and automotive electronics, for example. The electronic component 1 has two coil components 2 arranged in parallel.

As shown in FIGS. 1 and 2, each of the coil components 2 includes four layers of spiral wirings 21 to 24, an insulating resin body 35 individually covering four layers of the spiral wirings 21 to 24, and a magnetic resin 40 covering the insulating resin body 35. In this description, covering an object means covering at least a portion of the object. In FIG. 1, the insulating resin body 35 is not shown.

The first to fourth spiral wirings 21 to 24 are arranged in order from a lower layer to an upper layer. The first to fourth spiral wirings 21 to 24 are each formed into a spiral shape in a plane. The first to fourth spiral wirings 21 to 24 are made of low resistance metal such as Cu, Ag, and Au, for example. Preferably, the spiral wirings with a low resistance and a narrow pitch can be formed by using Cu plating formed by a semi-additive process.

The insulating resin body 35 has a base insulating resin and first to fourth insulating resins 31 to 34. The base insulating resin 30 and the first to fourth insulating resins 31 to 34 are arranged in order from a lower layer to an upper layer. The material of the insulating resins 30 to 34 is, for example, a single material that is an organic insulating material made of an epoxy resin, bismaleimide, liquid crystal polymer, polyimide, etc., or is an insulating material comprising a combination with an inorganic filler material such as a silica filler and an organic filler made of a rubber material. Preferably, all the insulating resins 30 to 34 are made of the same material. In this embodiment, all the insulating resins 30 to 34 are made of an epoxy resin containing a silica filler.

The first spiral wiring 21 is laminated on the base insulating resin 30. The first insulating resin 31 is laminated on the first spiral wiring 21 to cover the first spiral wiring 21. The second spiral wiring 22 is laminated on the first insulating resin 31. The second insulating resin 32 is laminated on the second spiral wiring 22 to cover the second spiral wiring 22.

The third spiral wiring 23 is laminated on the second insulating resin 32. The third insulating resin 33 is laminated on the third spiral wiring 23 to cover the third spiral wiring 23. The fourth spiral wiring 24 is laminated on the third insulating resin 33. The fourth insulating resin 34 is laminated on the fourth spiral wiring 24 to cover the fourth spiral wiring 24.

The second spiral wiring 22 is connected to the first spiral wiring 21 through a via wiring 25 extending in a lamination direction. The via wiring 25 is disposed in the first insulating resin 31. An inner circumferential end 21a of the first spiral wiring 21 and an inner circumferential end 22a of the second spiral wiring 22 are connected through the via wiring 25. An outer circumferential end 21b of the first spiral wiring 21 is connected to an external electrode not shown. An outer circumferential end 22b of the second spiral wiring 22 is connected to an external electrode not shown.

The fourth spiral wiring 24 is connected to the third spiral wiring 23 through a via wiring 26 extending in the lamination direction. The via wiring 26 is disposed in the third insulating resin 33. An inner circumferential end 23a of the third spiral wiring 23 and an inner circumferential end 24a of the fourth spiral wiring 24 are connected through the via wiring 26. An outer circumferential end 23b of the third spiral wiring 23 is connected to an external electrode not shown. An outer circumferential end 24b of the fourth spiral wiring 24 is connected to an external electrode not shown.

The first to fourth spiral wirings 21 to 24 are arranged around the same axis. The first spiral wiring 21 and the second spiral wiring 22 are wound in the same direction when viewed in the axis direction (lamination direction). The third spiral wiring 23 and the fourth spiral wiring 24 are wound in the same direction when viewed in the axis direction. The first and second spiral wirings 21, 22 and the third and fourth spiral wirings 23, 24 are wound in the directions opposite to each other when viewed in the axis direction.

The inner and outer surfaces of the first to fourth spiral wirings 21 to 24 are covered with the insulating resin body 35. The insulating resin body 35 has a hole part 35a around the same axis of the first to fourth spiral wirings 21 to 24.

The magnetic resin 40 covers the insulating resin body 35. The magnetic resin 40 has an inner portion 41 disposed in the hole part 35a of the insulating resin body 35 and an outer portion 42 disposed on the outside (an outer circumferential surface and upper and lower end surfaces) of the insulating resin body 35. The inner portion 41 constitutes an inner magnetic path of the coil component 2 and the outer portion 42 constitutes an outer magnetic path of the coil component 2.

The material of the magnetic resin 40 is, for example, a resin material containing magnetic powder. The magnetic powder is, for example, a metal magnetic material such as Fe, Si, and Cr and the resin material is, for example, a resin material such as epoxy. For improvement of the characteristics of the coil component (L-value and superposition characteristics), it is desirable to contain the magnetic powder at 90 wt % or more and, for improvement of a filling property of the magnetic resin 40, it is more desirable to mix two or three types of magnetic powder different in particle size distribution.

A method of manufacturing the coil component 2 will be described.

Figure 3A:
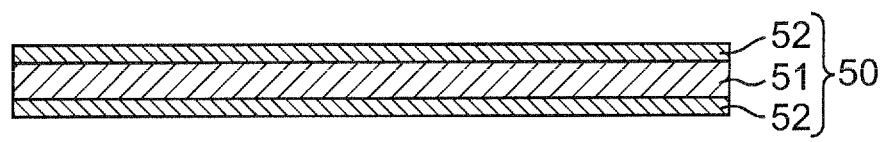
FIG. 3A is an explanatory view for explaining an embodiment of a manufacturing method of the coil component of the present disclosure.

As shown in FIG. 3A, a base 50 is prepared. The base 50 has an insulating substrate 51 and base metal layers 52 disposed on both surfaces of the insulating substrate 51. In this embodiment, the insulating substrate 51 is a glass epoxy substrate and the base metal layers 52 are Cu foils.

Figure 3B:
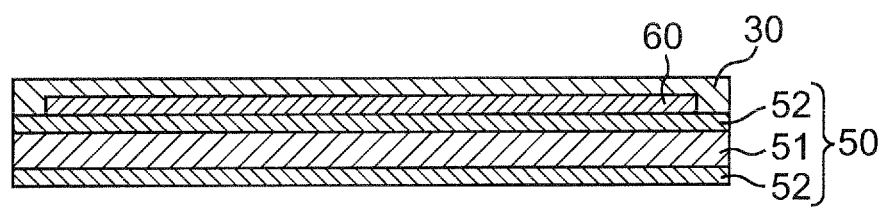
FIG. 3B is an explanatory view for explaining the embodiment of the manufacturing method of the coil component of the present disclosure.

As shown in FIG. 3B, a dummy metal layer 60 is bonded onto the base 50. The dummy metal layer 60 is a Cu foil. Since the dummy metal layer 60 is bonded to the base metal layer 52 of the base 50, the dummy metal layer 60 is bonded to a smooth surface of the base metal layer 52. Therefore, an adhesion force can be made weak between the dummy metal layer 60 and the base metal layer 52 and, at a subsequent step, the base 50 can easily be peeled from the dummy metal layer 60. Preferably, an adhesive bonding the base 50 and the dummy metal layer 60 is an adhesive with low tackiness. For weakening of the adhesion force between the base 50 and the dummy metal layer 60, it is desirable that the base 50 and the dummy metal layer 60 have glossy surfaces at a boundary plane.

Subsequently, the base insulating resin 30 is laminated on the dummy metal layer 60 temporarily bonded to the base 50. In this case, the base insulating resin 30 is laminated by a vacuum laminator and is then thermally cured.

Figure 3C:
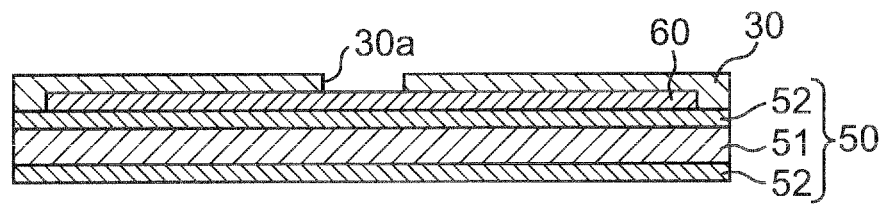
FIG. 3C is an explanatory view for explaining the embodiment of the manufacturing method of the coil component of the present disclosure.

As shown in FIG. 3C, an opening part 30a is disposed in a portion of the base insulating resin 30 to expose the dummy metal layer 60. The opening part 30a is formed by laser processing.

Figure 3D:
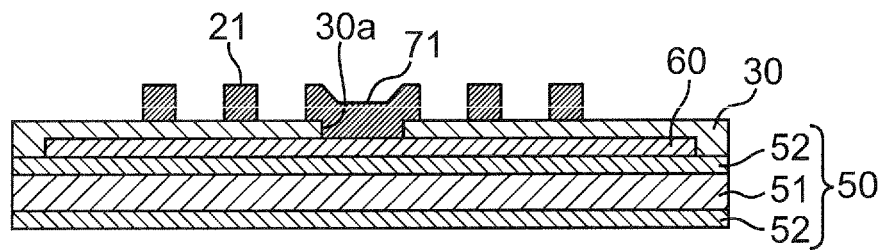
FIG. 3D is an explanatory view for explaining the embodiment of the manufacturing method of the coil component of the present disclosure.

As shown in FIG. 3D, the first spiral wiring 21 is disposed on the base insulating resin 30, and a first sacrificial conductor 71 corresponding to the inner magnetic path is disposed on the dummy metal layer 60 in the opening part 30a of the base insulating resin 30. In this case, the first spiral wiring 21 and the first sacrificial conductor 71 are formed at the same time by SAP (semi-additive process).

Figure 3E:
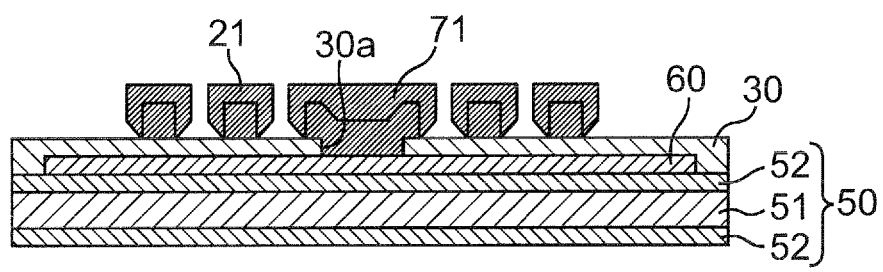
FIG. 3E is an explanatory view for explaining the embodiment of the manufacturing method of the coil component of the present disclosure.

As shown in FIG. 3E, the first spiral wiring 21 is indirectly energized to enlarge the first spiral wiring 21 by plating, and the dummy metal layer 60 is energized to enlarge the first sacrificial conductor 71 connected to the dummy metal layer 60 by plating. As a result, the spiral wiring with a low resistance and a narrow pitch can be formed. In this case, by connecting the first spiral wiring 21 to a wiring pattern not shown, the first spiral wiring 21 is indirectly energized through the wiring pattern. The first spiral wiring 21 may directly be energized. The first spiral wiring 21 and the first sacrificial conductor 71 may be formed at the same time, so that the processing time can be shortened.

Figure 3F:
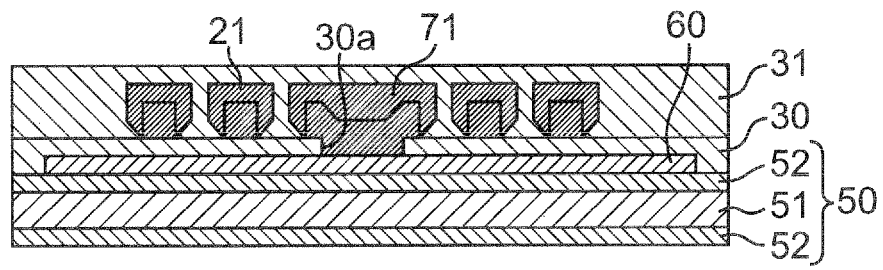
FIG. 3F is an explanatory view for explaining the embodiment of the manufacturing method of the coil component of the present disclosure.

As shown in FIG. 3F, the first spiral wiring 21 and the first sacrificial conductor 71 are covered with the first insulating resin 31. In this case, the first insulating resin 31 is laminated by a vacuum laminator and is then thermally cured. Subsequently, a via hole for filling the via wiring 25 is formed in the first insulating resin 31 by laser processing.

Figure 3G:
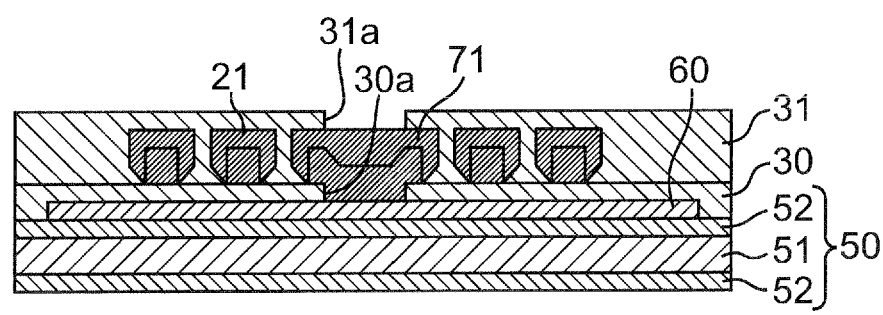
FIG. 3G is an explanatory view for explaining the embodiment of the manufacturing method of the coil component of the present disclosure.

As shown in FIG. 3G, an opening part 31a is disposed in a portion of the first insulating resin 31 to expose the first sacrificial conductor 71. The opening part 31a is formed by laser processing.

Figure 3H:
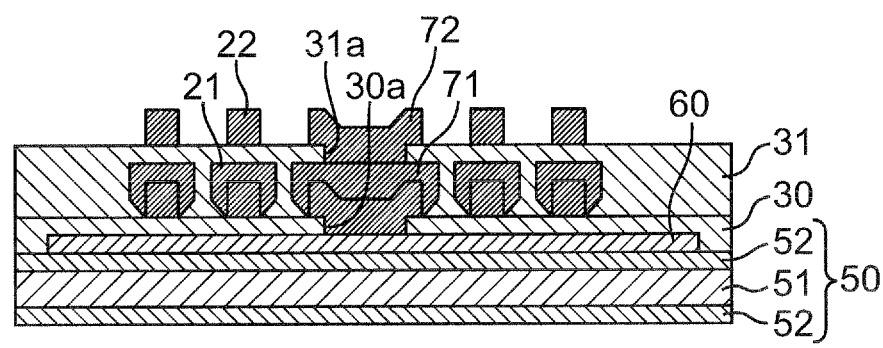
FIG. 3H is an explanatory view for explaining the embodiment of the manufacturing method of the coil component of the present disclosure.

As shown in FIG. 3H, the second spiral wiring 22 is disposed on the first insulating resin 31, and a second sacrificial conductor 72 corresponding to the inner magnetic path is formed on the first sacrificial conductor 71 in the opening part 31a of the first insulating resin 31. The process of second and subsequent layers is the same as the process of the first layer.

Figure 3I:
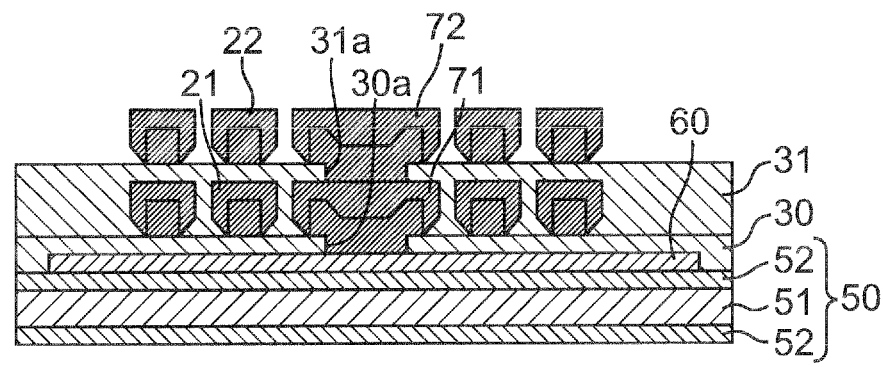
FIG. 3I is an explanatory view for explaining the embodiment of the manufacturing method of the coil component of the present disclosure.

As shown in FIG. 3I, the second spiral wiring 22 is directly or indirectly energized to enlarge the second spiral wiring 22 by plating, and the dummy metal layer 60 is energized to enlarge the second sacrificial conductor 72 by plating through the first sacrificial conductor 71.

Figure 3J:
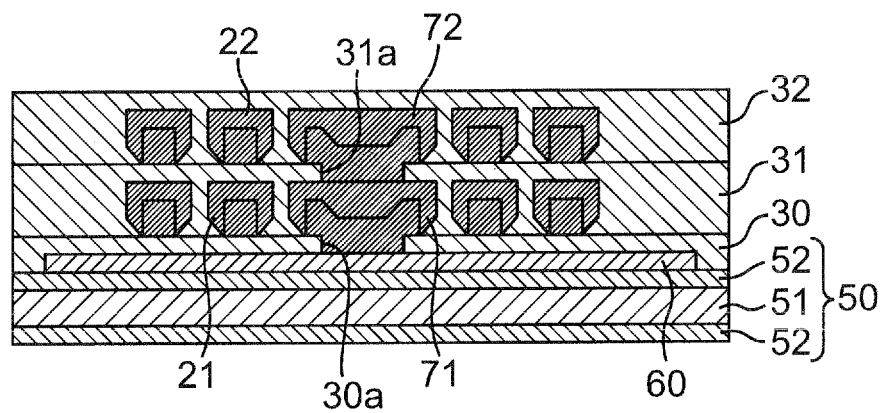
FIG. 3J is an explanatory view for explaining the embodiment of the manufacturing method of the coil component of the present disclosure.

As shown in FIG. 3J, the second spiral wiring 22 and the second sacrificial conductor 72 are covered with the second insulating resin 32. In this case, the second insulating resin 32 is disposed by the same process as the first insulating resin 31.

Figure 3K:
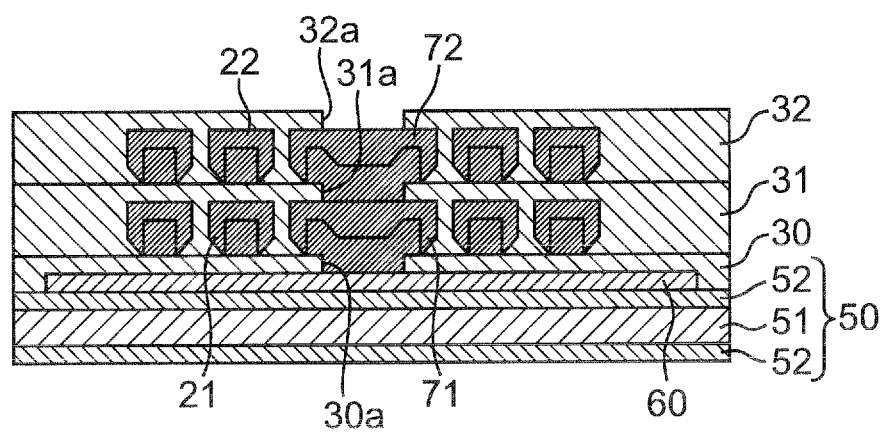
FIG. 3K is an explanatory view for explaining the embodiment of the manufacturing method of the coil component of the present disclosure.

As shown in FIG. 3K, an opening part 32a is disposed in a portion of the second insulating resin 32 to expose the second sacrificial conductor 72. The opening part 32a is formed by laser processing.

Figure 3L:
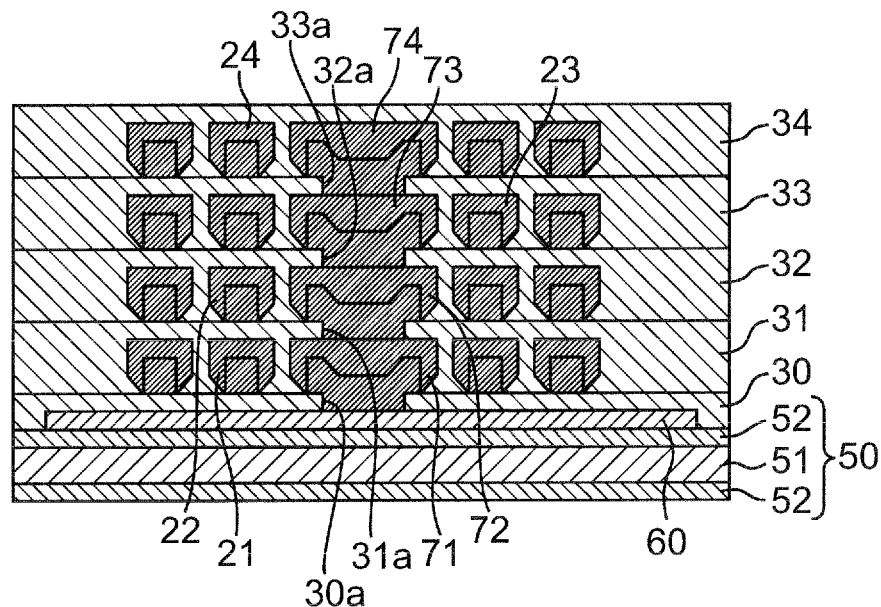
FIG. 3L is an explanatory view for explaining the embodiment of the manufacturing method of the coil component of the present disclosure.

As shown in FIG. 3L, the same process as the second layer is executed to dispose the third spiral wiring 23, a third sacrificial conductor 73, and the third insulating resin 33 in the third layer, and the fourth spiral wiring 24, a fourth sacrificial conductor 74, and the fourth insulating resin 34 in the fourth layer. By energizing the dummy metal layer 60, the third sacrificial conductor 73 is energized through the first and second sacrificial conductors 71, 72 and is enlarged by plating. By energizing the dummy metal layer 60, the fourth sacrificial conductor 74 is energized through the first to third sacrificial conductors 71 to 73 and is enlarged by plating. A via hole for filling the via wiring 26 is formed in the third insulating resin 33 by laser processing.

Figure 3M:
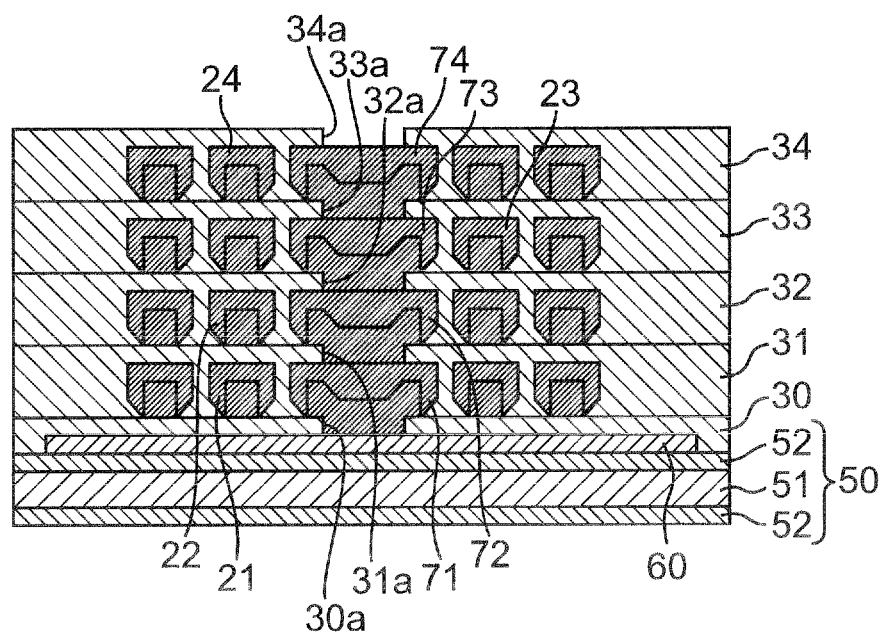
FIG. 3M is an explanatory view for explaining the embodiment of the manufacturing method of the coil component of the present disclosure.

As shown in FIG. 3M, an opening part 34a is disposed in a portion of the fourth insulating resin 34 to expose the fourth sacrificial conductor 74.

Figure 3N:
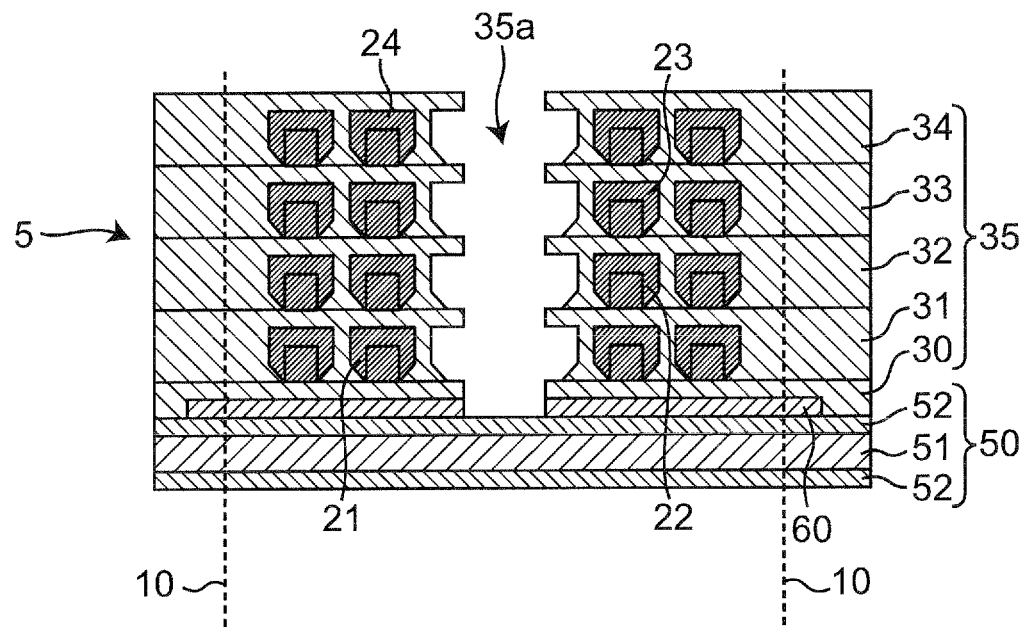
FIG. 3N is an explanatory view for explaining the embodiment of the manufacturing method of the coil component of the present disclosure.

As shown in FIG. 3N, the first to fourth sacrificial conductors 71 to 74 are removed by etching from the opening part 34a of the fourth insulating resin 34 to form the hole part 35a corresponding to the inner magnetic path in the insulating resin body 35 made up of the spiral wirings 21 to 24 and the insulating resins 30 to 34. The material of the sacrificial conductors 71 to 74 is the same as the material of the spiral wirings 21 to 24, for example. In this way, a coil substrate 5 is formed by the spiral wirings 21 to 24 and the insulating resins 30 to 34.

Figure 3O:
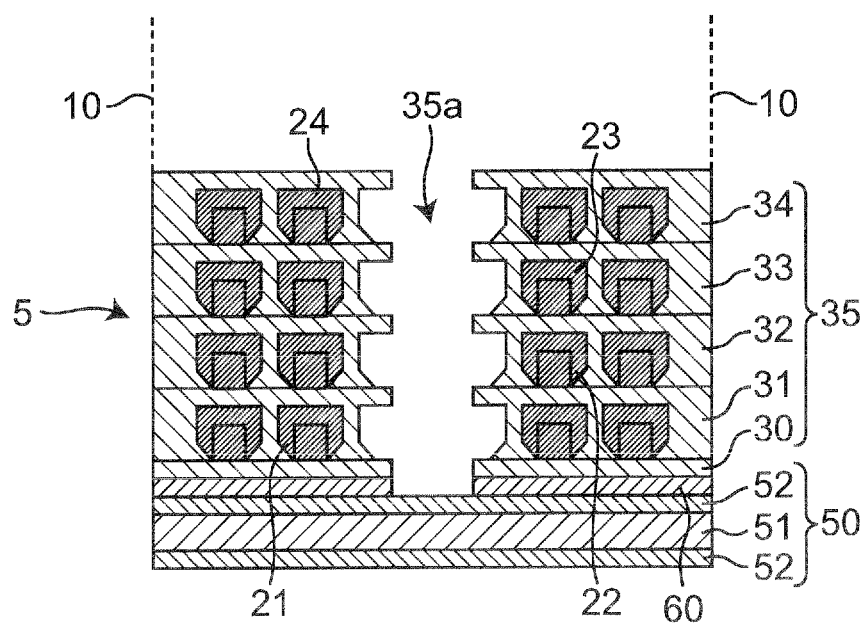
FIG. 3O is an explanatory view for explaining the embodiment of the manufacturing method of the coil component of the present disclosure.

As shown in FIG. 3O, an end portion of the coil substrate 5 is cut off along a cutline 10 together with an end portion of the base 50. The cutline 10 is located on the inner side from an end surface of the dummy metal layer 60.

Figure 3P:
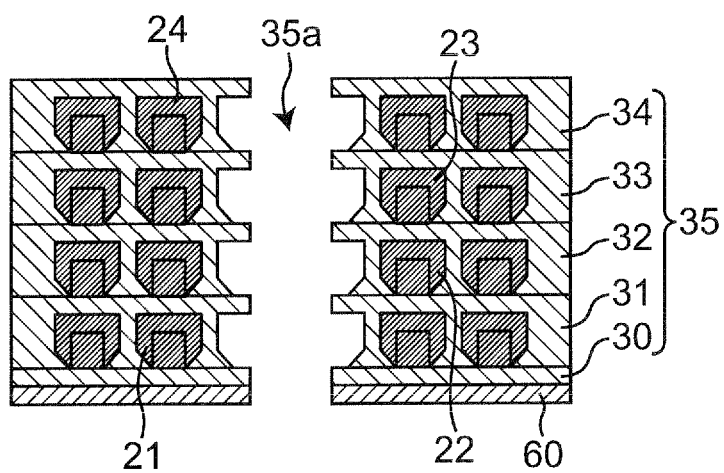
FIG. 3P is an explanatory view for explaining the embodiment of the manufacturing method of the coil component of the present disclosure.

As shown in FIG. 3P, the base 50 is peeled from the dummy metal layer 60 at the boundary plane between one surface of the base 50 (the base metal layer 52) and the dummy metal layer 60.

Figure 3Q:
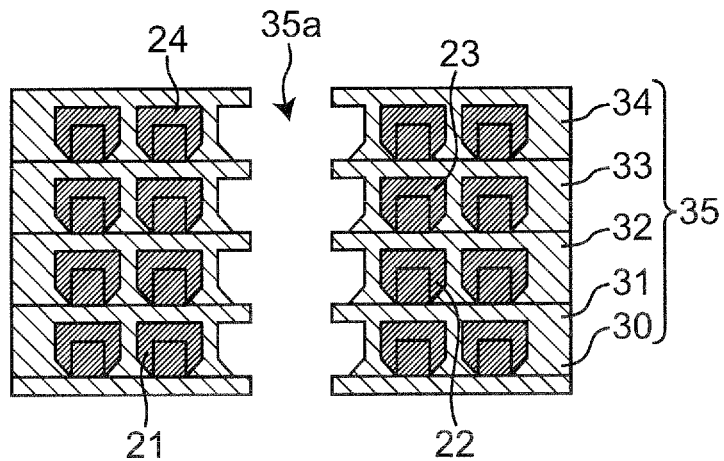
FIG. 3Q is an explanatory view for explaining the embodiment of the manufacturing method of the coil component of the present disclosure.

As shown in FIG. 3Q, the dummy metal layer 60 is removed from the coil substrate 5. In this case, the dummy metal layer 60 is removed by etching. The first to fourth spiral wirings 21 to 24 are covered with the insulating resin body 35 made up of the base insulating resin 30 and the first to fourth insulating resins 31 to 34.

Figure 3R:
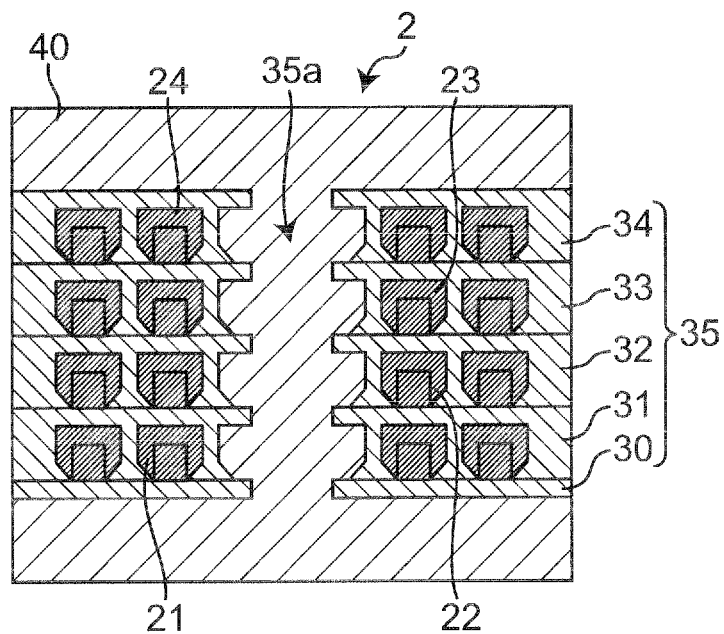
FIG. 3R is an explanatory view for explaining the embodiment of the manufacturing method of the coil component of the present disclosure.

As shown in FIG. 3R, the coil substrate 5 is covered with the magnetic resin 40. In this case, a plurality of sheets of the shaped magnetic resin 40 is disposed on both sides of the coil substrate 5 in the lamination direction, is heated and press-bonded by a vacuum laminator or a vacuum press machine, and is subsequently subjected to a cure treatment. The magnetic resin 40 is filled into the hole part 35a of the insulating resin body 35 to construct the inner magnetic path and is disposed outside the insulating resin body 35 to construct the outer magnetic path. External terminals (not shown) are then connected to the end portions of the spiral wirings 21 to 24 to form the coil component 2.

Figure 4:
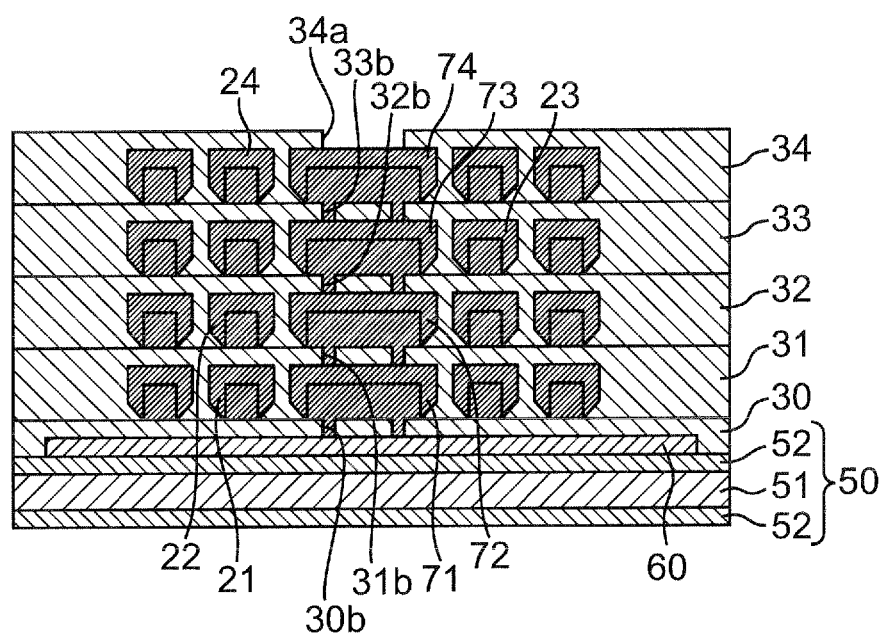
FIG. 4 is an explanatory view for explaining another embodiment of the manufacturing method of the coil component of the present disclosure.

As shown in FIG. 3M, the opening part 30a of the base insulating resin 30, the opening part 31a of the first insulating resin 31, the opening part 32a of the second insulating resin 32, and the opening part 33a of the third insulating resin 33 are fully opened; however, as shown in FIG. 4, an opening part 30b of the base insulating resin 30, an opening part 31b of the first insulating resin 31, an opening part 32b of the second insulating resin 32, and an opening part 33b of the third insulating resin 33 may annularly be opened. This can reduce the processing load of the opening by laser processing etc. Additionally, since the insulating resin is left in the center of the opening parts, the material of the sacrificial conductors to be used can be reduced.

According to the method of manufacturing the coil component 2, the first spiral wiring 21 and the first sacrificial conductor 71 are disposed at one step. In particular, the first spiral wiring 21 and the first sacrificial conductor 71 are both conductors and therefore can be formed at one step. The same applies to the case of disposing the second to fourth spiral wirings 22 to 24 and the second to fourth sacrificial conductors 72 to 74. This reduces the total of the position tolerance of the hole part 35a (the sacrificial conductors 71 to 74) for the inner magnetic path with respect to the insulating resins 30 to 34 and the position tolerance of the spiral wirings 21 to 24 with respect to the insulating resins 30 to 34. As a result, the cross-sectional area of the inner magnetic path can be increased and a higher inductance value can be acquired.

In contrast, if a step of forming the hole part for the inner magnetic path in the insulating resin and a step of forming the spiral wirings in the insulating resin are performed as separate steps as in a conventional method, a certain distance is required between the spiral wirings and the hole part in consideration of the total of the position tolerance of the hole part with respect to the insulating resin and the position tolerance of the spiral wirings with respect to the insulating resin. Therefore, the cross-sectional area of the hole part becomes smaller by the position tolerance of the hole part and the position tolerance of the spiral wirings. As a result, the cross-sectional area of the inner magnetic path becomes small and a high inductance value is difficult to acquire.

The first spiral wiring 21 is directly or indirectly energized to enlarge the first spiral wiring 21 by plating, and the dummy metal layer 60 is energized to enlarge the first sacrificial conductor 71 connected to the dummy metal layer 60 by plating. As a result, a difference can be eliminated between the thickness of the first spiral wiring 21 and the thickness of the first sacrificial conductor 71. Therefore, when the opening part 31a is disposed in a portion of the first insulating resin 31 covering the first spiral wiring 21 and the first sacrificial conductor 71 to expose the first sacrificial conductor 71, the depth of the opening part 31a is shallow, so that the opening part 31a can easily be formed.

The second spiral wiring 22 is directly or indirectly energized to enlarge the second spiral wiring 22 by plating and the dummy metal layer 60 is energized to enlarge the second sacrificial conductor 72 by plating through the first sacrificial conductor 71. As a result, a difference can be eliminated between the thickness of the second spiral wiring 22 and the thickness of the second sacrificial conductor 72. Therefore, the depth of the opening part 32a disposed in the second insulating resin 32 is the same as the depth of the opening part 31a of the first insulating resin 31. Furthermore, even when multiple layers are formed, the depths of the opening parts 31a to 34a are constant, so that the opening parts 31a to 34a can easily be formed. Additionally, the shapes of the sacrificial conductors 71 to 74 disposed in the opening parts 31a to 34a can be made constant.

Figure 5A:
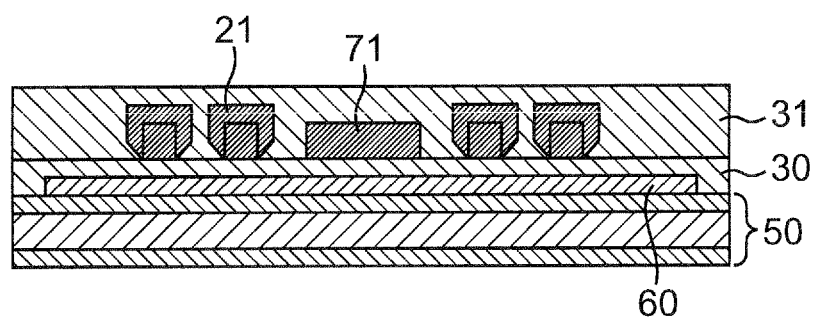
FIG. 5A is an explanatory view for explaining a comparative example of the manufacturing method of the coil component.
Figure 5B:
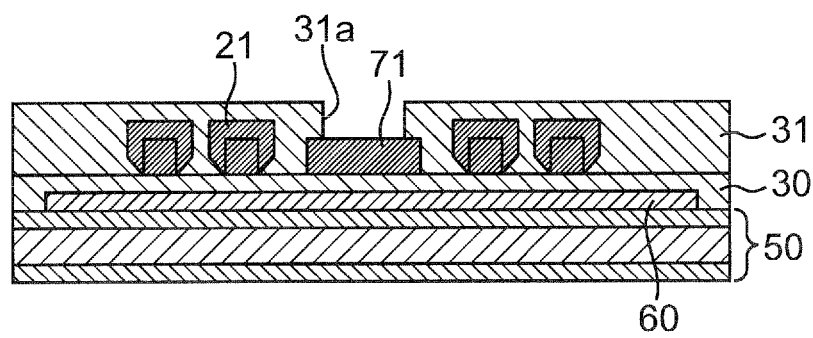
FIG. 5B is an explanatory view for explaining the comparative example of the manufacturing method of the coil component.
Figure 5C:
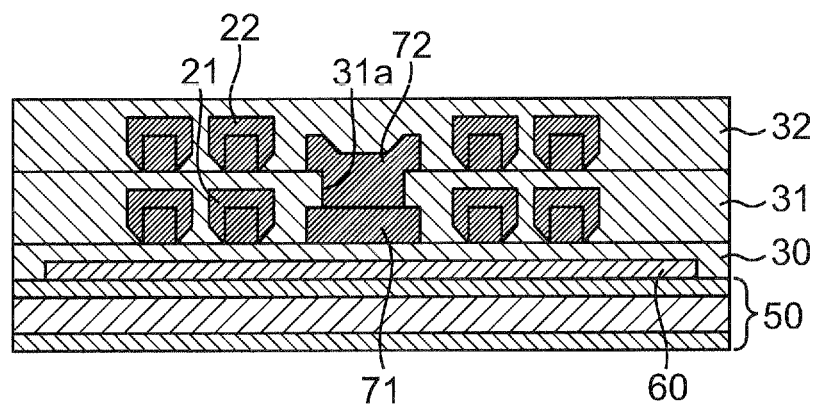
FIG. 5C is an explanatory view for explaining the comparative example of the manufacturing method of the coil component.
Figure 5D:
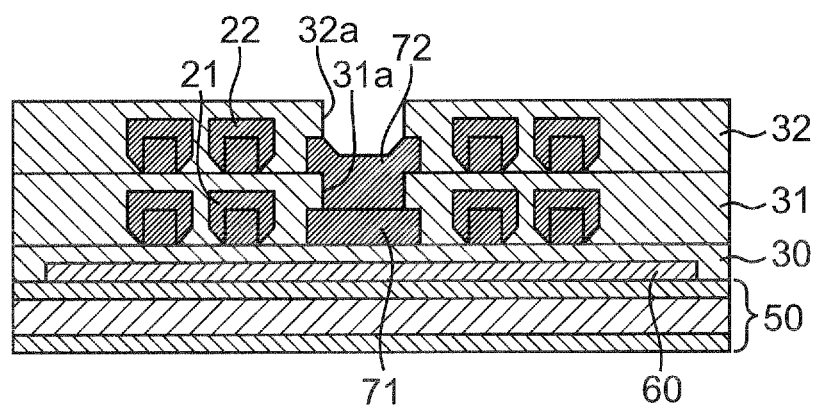
FIG. 5D is an explanatory view for explaining the comparative example of the manufacturing method of the coil component.
Figure 5E:
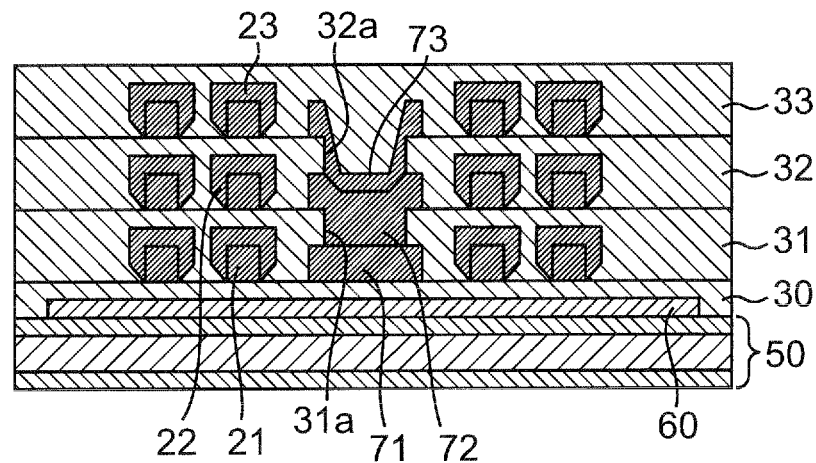
FIG. 5E is an explanatory view for explaining the comparative example of the manufacturing method of the coil component.
Figure 5F:
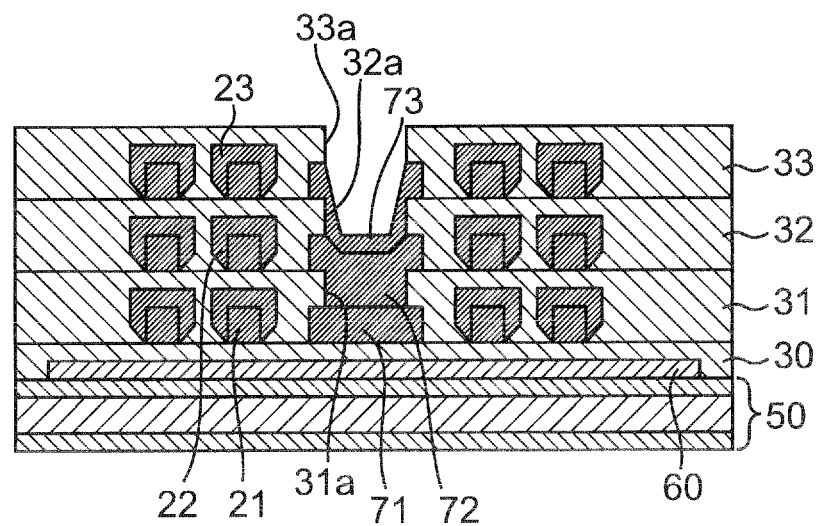
FIG. 5F is an explanatory view for explaining the comparative example of the manufacturing method of the coil component.
Figure 5G:
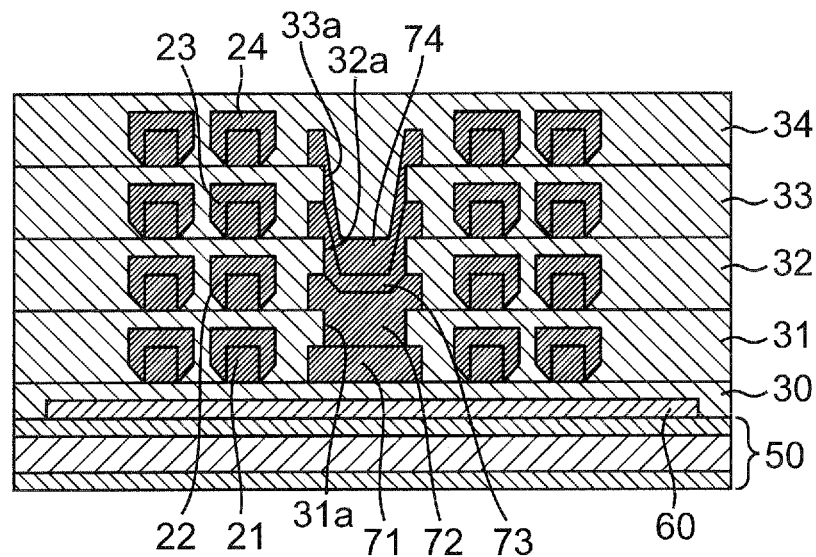
FIG. 5G is an explanatory view for explaining the comparative example of the manufacturing method of the coil component.
Figure 5H:
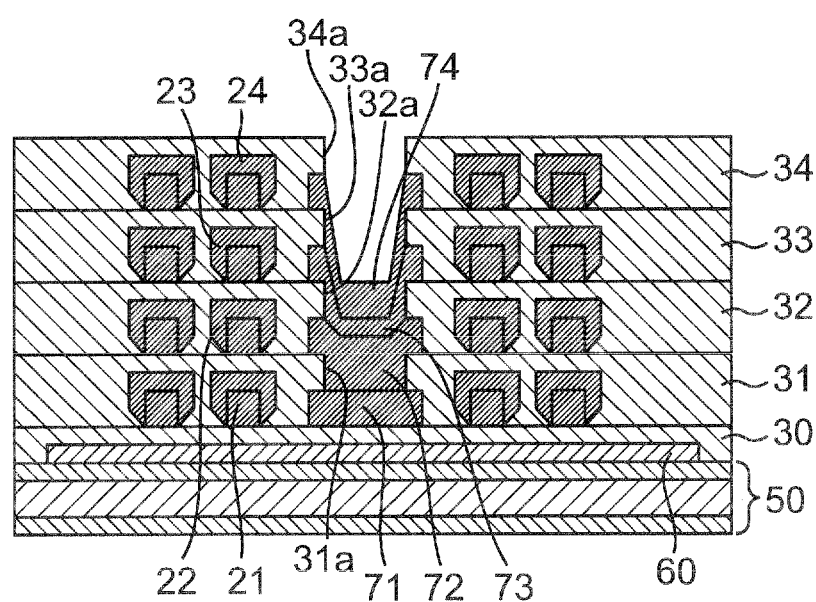
FIG. 5H is an explanatory view for explaining the comparative example of the manufacturing method of the coil component.

In contrast, as shown in FIG. 5A, if the first spiral wiring 21 is enlarged by plating while the first sacrificial conductor 71 is not enlarged by plating, a difference is generated between the thickness of the first spiral wiring 21 and the thickness of the first sacrificial conductor 71. Therefore, as shown in FIG. 5B, when the opening part 31a is disposed in a portion of the first insulating resin 31 covering the first spiral wiring and the first sacrificial conductor 71 to expose the first sacrificial conductor 71, the depth of the opening part 31a becomes deep. Particularly, when the second spiral wiring 22 and the second sacrificial conductor 72 are disposed as shown in FIG. 5C and the opening part 32a is disposed in the second insulating resin 32 as shown in FIG. 5D, the depth of the opening 32a becomes deeper. Furthermore, as shown in FIGS. 5E to 5H, the depth of the opening parts 33a, 34a becomes deeper as the number of layers increases, which makes it difficult to form the opening parts 33a, 34a. In particular, since the opening parts 31a to 34a of the respective layers are gradually deepened, when the opening parts 31a to 34a are formed by laser processing, the focus of the laser must be shifted in each layer. It is also difficult to dispose the sacrificial conductors 71 to 74 in the opening parts 31a to 34a.

According to the method of manufacturing the coil component 2, since the base 50 is peeled from the dummy metal layer 60 at the boundary plane between one surface of the base 50 and the dummy metal layer 60, the insulating resins 30 to 34 are not in contact with the base 50. Therefore, at the time of thermal shock or reflow loading, delamination can be prevented from occurring due to thermal stress generated by a difference in linear expansion coefficient between the base 50 and the insulating resins 30 to 34.

Since the coil substrate 5 is formed by laminating the insulating resins 30 to 34 and the spiral wirings 21 to 24 on the base 50, the shrinkage of the insulating resins 30 to 34 and the processing distortion caused by a difference in linear expansion coefficient between the base 50 and the insulating resins 30 to 34 can be reduced by increasing the thickness of the base 50. In particular, when the coil substrate 5 is multi-layered, the processing distortion can effectively be reduced to achieve higher accuracy. Since the base 50 is subsequently peeled from the coil substrate 5, the coil component 2 can be made thinner. Therefore, both multi-layering and higher accuracy can be achieved without increasing the thickness of the coil component 2.

Since the coil component 2 can be made up of the insulating resins 30 to 34 and the spiral wires 21 to 24, the density of the spiral wires 21 to 24 can be made higher. Therefore, the L value can be increased and Rdc can be reduced to achieve higher performance.

Further, since all the insulating resins 30 to 34 are made of the same material, the difference in linear expansion coefficient can be eliminated between the insulating resins 30 to 34, and the delamination of the insulating resins 30 to 34 can be prevented at the time of thermal shock or reflow loading.

The present disclosure is not limited to the embodiments described above and can be changed in design without departing from the spirit of the present disclosure.

Although the coil component has four layers of the spiral wirings and five layers of the insulating resins in the embodiments, the coil component may have at least one layer of the spiral wiring (the first spiral wiring) and at least two layers of the insulating resins (the base insulating resin, the first insulation resin).

Although the base has the insulating substrate and the base metal layer in the embodiments, only the insulating substrate may be included without the base metal layer.

Although the coil substrate is formed on one of both surfaces of the base in the embodiments, a coil substrate may be formed on each of both surfaces of the substrate. As a result, higher productivity can be achieved.

Although the dummy metal layer is bonded on the base in the embodiments, a dummy metal layer may be disposed on the base by printing etc.

Although the base is peeled from the dummy metal layer at the boundary plane between the base and the dummy metal layer in the embodiments, the base may be scraped off, or the base may be left as it is.

In the embodiments, the shapes of the sacrificial conductors are the same in each layer; however, in this manufacturing method, the opening corresponding to the inner magnetic path can be acquired even if the shapes are not the same as long as portions of the sacrificial conductors can be connected between the layers.

In the embodiment, the manufacturing method is described by taking as an example the opening for the inner magnetic path that is a magnetic path formed inside a spiral coil; however, the outer magnetic path formed outside the spiral coil can also be manufactured by the same method.

Although the first spiral wiring and the first sacrificial conductor are enlarged by plating in the embodiments, only the first sacrificial conductor may be enlarged by plating without enlarging the first spiral wiring by plating.

Also in the manufacturing method described above, the first spiral wiring and the first sacrificial conductor are disposed at one step as in the embodiments. In particular, the first spiral wiring and the first sacrificial conductor are both conductors and therefore can be formed at one step. This reduces the total of the position tolerance of the hole part (the sacrificial conductor) for the inner magnetic path with respect to the insulating resin and the position tolerance of the spiral wiring with respect to the insulating resin. As a result, the cross-sectional area of the inner magnetic path can be increased and a higher inductance value can be acquired.

Additionally, as in the embodiments, the dummy metal layer is energized to enlarge the first sacrificial conductor connected to the dummy metal layer by plating. As a result, a gap between the first spiral wiring and the first sacrificial conductor can be made narrower than the resolution of photolithography. Consequently, as in the embodiments, the cross-sectional area of the inner magnetic path can be made larger and the number of turns of the spiral wiring can be increased, so that a higher inductance value can be acquired.

Although the second spiral wiring and the second sacrificial conductor are enlarged by plating in the embodiments, only the second sacrificial conductor may be enlarged by plating without enlarging the second spiral wiring by plating.

Also in the manufacturing method described above, the second spiral wiring and the second sacrificial conductor are disposed at one step as in the embodiments. In particular, the second spiral wiring and the second sacrificial conductor are both conductors and therefore can be formed at one step. This reduces the total of the position tolerance of the hole part (the sacrificial conductor) for the inner magnetic path with respect to the insulating resin and the position tolerance of the spiral wiring with respect to the insulating resin. As a result, the cross-sectional area of the inner magnetic path can be increased and a higher inductance value can be acquired.

Additionally, as in the embodiments, the dummy metal layer is energized to enlarge the second sacrificial conductor by plating through the first sacrificial conductor. As a result, a gap between the second spiral wiring and the second sacrificial conductor can be made narrower than the resolution of photolithography. Consequently, as in the embodiments, the cross-sectional area of the inner magnetic path can be made larger and the number of turns of the spiral wiring can be increased, so that a higher inductance value can be acquired.

The invention claimed is:

1. A method of manufacturing a coil component comprising the steps of:
   disposing a dummy metal layer on a base;
   laminating a base insulating resin on the dummy metal layer;
   exposing the dummy metal layer by disposing an opening part in the base insulating resin;
   disposing a first spiral wiring on the base insulating resin and disposing a first sacrificial conductor corresponding to an inner magnetic path on the dummy metal layer in the opening part of the base insulating resin;
   enlarging the first sacrificial conductor connected to the dummy metal layer by plating by energizing the dummy metal layer;
   covering the first spiral wiring and the first sacrificial conductor with a first insulating resin;
   exposing the first sacrificial conductor by disposing an opening part in the first insulating resin;
   forming a hole part corresponding to the inner magnetic path by removing the first sacrificial conductor by etching from the opening part of the first insulating resin; and constructing the inner magnetic path of a magnetic resin by filling the hole part with the magnetic resin.

2. The method of manufacturing a coil component according to claim 1, wherein the enlarging the first sacrificial conductor by plating includes enlarging the first spiral wiring by plating by energizing the first spiral wiring, and enlarging the first sacrificial conductor connected to the dummy metal layer by plating by energizing the dummy metal layer.

3. The method of manufacturing a coil component according to claim 2, further comprising between the exposing the first sacrificial conductor and the forming the hole part, disposing a second spiral wiring on the first insulating resin and disposing a second sacrificial conductor corresponding to the inner magnetic path on the first sacrificial conductor in the opening part of the first insulating resin, enlarging the second spiral wiring by plating by directly or indirectly energizing the second spiral wiring, and enlarging the second sacrificial conductor by plating through the first sacrificial conductor by energizing the dummy metal layer, covering the second spiral wiring and the second sacrificial conductor with the second insulating resin, and exposing the second sacrificial conductor by disposing an opening part in the second insulating resin, wherein the forming the hole part includes forming the hole part corresponding to the inner magnetic path by removing the first sacrificial conductor and the second sacrificial conductor by etching from the opening part of the second insulating resin.

4. The method of manufacturing a coil component according to claim 3, wherein the enlarging the first spiral wiring and the first sacrificial conductor by plating includes energizing the first spiral wiring and the first sacrificial conductor at the same time, and wherein the enlarging the second spiral wiring and the second sacrificial conductor by plating includes energizing the second spiral wiring and the second sacrificial conductor at the same time.

5. The method of manufacturing a coil component according to claim 1, further comprising between the exposing the first sacrificial conductor and the forming the hole part, disposing a second spiral wiring on the first insulating resin and disposing a second sacrificial conductor corresponding to the inner magnetic path on the first sacrificial conductor in the opening part of the first insulating resin, enlarging the second sacrificial conductor by plating through the first sacrificial conductor by energizing the dummy metal layer, covering the second spiral wiring and the second sacrificial conductor with a second insulating resin, and exposing the second sacrificial conductor by disposing an opening part in the second insulating resin, wherein the forming the hole part includes forming the hole part corresponding to the inner magnetic path by removing the first sacrificial conductor and the second sacrificial conductor by etching from the opening part of the second insulating resin.

6. The method of manufacturing a coil component according to claim 5, wherein the enlarging the second sacrificial conductor by plating includes enlarging the second spiral wiring by plating by energizing the second spiral wiring, and enlarging the second sacrificial conductor by plating through the first sacrificial conductor by energizing the dummy metal layer.

7. The method of manufacturing a coil component according to claim 5, wherein the opening part of the base insulating resin and the opening part of the first insulating resin are annularly opened.

8. The method of manufacturing a coil component according to claim 1, further comprising between the forming the hole part and the constructing the inner magnetic path, peeling the base from the dummy metal layer at a boundary plane between the base and the dummy metal layer.

\* \* \* \* \*